(12) United States Patent
Murakami et al.

(10) Patent No.: US 8,451,066 B2
(45) Date of Patent: May 28, 2013

(54) PLL CIRCUIT AND ANGULAR VELOCITY SENSOR USING THE SAME

(75) Inventors: Hideyuki Murakami, Osaka (JP); Takashi Kawai, Fukui (JP); Kouji Nabetani, Fukui (JP)

(73) Assignee: Panasonic Corporation, Osaka (JP)

( * ) Notice: Subject to any disclaimer, the term of this patent is extended or adjusted under 35 U.S.C. 154(b) by 540 days.

(21) Appl. No.: 12/680,935

(22) PCT Filed: Nov. 7, 2008

(86) PCT No.: PCT/JP2008/003231
§ 371 (c)(1),
(2), (4) Date: Mar. 31, 2010

(87) PCT Pub. No.: WO2009/063603
PCT Pub. Date: May 22, 2009

(65) Prior Publication Data
US 2010/0206069 A1      Aug. 19, 2010

(30) Foreign Application Priority Data

Nov. 12, 2007  (JP) ................................. 2007-292830
Feb. 18, 2008  (JP) ................................. 2008-035594
Feb. 18, 2008  (JP) ................................. 2008-035595
Feb. 18, 2008  (JP) ................................. 2008-035596
Feb. 18, 2008  (JP) ................................. 2008-035597

(51) Int. Cl.
*H03L 7/085* (2006.01)
(52) U.S. Cl.
USPC ................. 331/25; 331/1 R; 331/1 A; 331/17; 73/504.12

(58) Field of Classification Search
CPC ............ H03L 7/085; H03L 7/091; H03L 7/093
USPC ............... 331/25, 18, 17, 1 R; 327/156, 157, 327/147; 73/504.12, 504.02
See application file for complete search history.

(56) References Cited

U.S. PATENT DOCUMENTS

| 5,477,194 A | 12/1995 | Nagakura |
| 6,489,906 B2 | 12/2002 | Matsumoto et al. |

(Continued)

FOREIGN PATENT DOCUMENTS

| CN | 1103217 | 5/1995 |
| GB | 2 333 916 | 8/1999 |

(Continued)

OTHER PUBLICATIONS

European Office Action issued Nov. 17, 2010 in corresponding European Application No. 08 85 0315.

(Continued)

*Primary Examiner* — Ryan Johnson
(74) *Attorney, Agent, or Firm* — Wenderoth, Lind & Ponack, L.L.P.

(57) ABSTRACT

A PLL circuit is provided with an AD converter, a DA converter to which output from the AD converter is inputted, a filter circuit filtering an output signal of the DA converter, a voltage control oscillator outputting a signal of a different frequency in accordance with an output signal from the filter circuit and a frequency divider dividing a signal which the voltage control oscillator outputs. The AD converter operates by a timing signal from the voltage control oscillator and the DA converter outputs an analog signal corresponding to a value which the AD converter outputs by the timing signal outputted from the frequency divider.

11 Claims, 7 Drawing Sheets

U.S. PATENT DOCUMENTS

| | | |
|---|---|---|
| 7,068,744 B2 | 6/2006 | Watanabe |
| 7,107,841 B2 | 9/2006 | Mori |
| 7,134,336 B2 | 11/2006 | Mase et al. |
| 7,183,863 B1 | 2/2007 | Bedrosian |
| 7,240,533 B2 * | 7/2007 | Fell et al. .................. 73/1.38 |
| 7,508,274 B2 * | 3/2009 | Keating ........................ 331/16 |
| 2001/0030621 A1 | 10/2001 | Matsumoto et al. |
| 2001/0052824 A1 | 12/2001 | Hasegawa et al. |
| 2003/0039325 A1 | 2/2003 | Watanabe |
| 2004/0196617 A1 | 10/2004 | Mori |
| 2005/0204815 A1 | 9/2005 | Mase et al. |
| 2006/0202733 A1 * | 9/2006 | Xu ............................... 327/291 |

FOREIGN PATENT DOCUMENTS

| | | |
|---|---|---|
| JP | 62-131630 | 6/1987 |
| JP | 7-249989 | 9/1995 |
| JP | 7-336174 | 12/1995 |
| JP | 2000-193459 | 7/2000 |
| JP | 2001-237706 | 8/2001 |
| JP | 2001-356017 | 12/2001 |
| JP | 2003-65768 | 3/2003 |
| JP | 2003-065768 | 3/2003 |
| JP | 2003-232637 | 8/2003 |
| JP | 2004-214932 | 7/2004 |
| JP | 2004-309280 | 11/2004 |
| JP | 2005-274458 | 10/2005 |
| JP | 4055577 | 3/2008 |

OTHER PUBLICATIONS

International Search Report issued Dec. 9, 2008 in International (PCT) Application No. PCT/JP2008/003231.

* cited by examiner

FIG. 7 – PRIOR ART
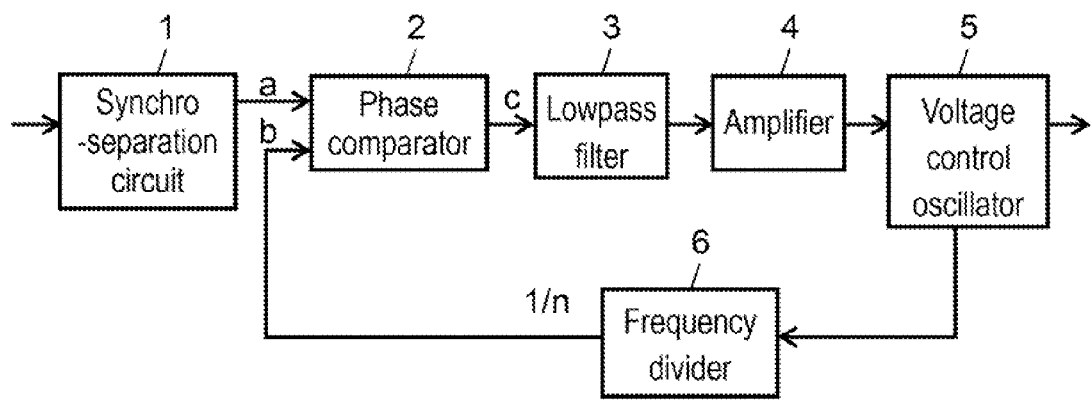
FIG. 8 – PRIOR ART
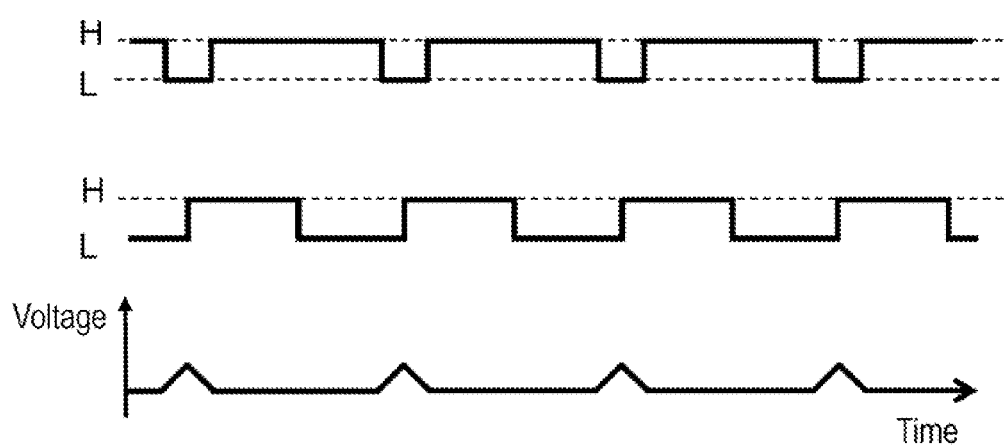

PLL CIRCUIT AND ANGULAR VELOCITY SENSOR USING THE SAME

This Application is a U.S. national phase application of PCT International Application PCT/W2008/003231, filed Nov. 7, 2008.

TECHNICAL FIELD

The present invention relates to a PLL circuit and an angular velocity sensor which includes the circuit; more specifically, it is related with those used in airplanes, ground vehicles or other mobile facilities for controlling the posture, also in navigation systems.

BACKGROUND ART

FIG. 7 shows circuit diagram of a conventional PLL circuit. In FIG. 7, synchronization separation circuit 1 takes synchronous signal away from a signal inputted from the outside. In a period when one of the input is L, phase comparator 2 changes an output voltage in accordance with a proportion high/low of the other input. Low-pass filter 3 removes noise signal from an output signal of phase comparator 2 and outputs it. Amplifier 4 amplifies a signal outputted from low-pass filter 3. Voltage control oscillator 5 changes an output frequency based on the voltage of a signal outputted from amplifier 4. Frequency divider 6 divides an output signal of voltage control oscillator 5 into 1/n.

Next, operation of the above-configured conventional PLL circuit is described.

FIG. 8 is a timing chart showing the operating state of a conventional PLL circuit. The top portion of FIG. 8 shows the voltage waveform of signal a, which is outputted from synchronization separation circuit 1 and inputted to phase comparator 2. The middle portion shows the voltage waveform of signal b, which is outputted from frequency divider 6 and inputted to phase comparator 2. Shown at the bottom is the voltage waveform of signal c, which is outputted from phase comparator 2 and inputted to low-pass filter 3.

As shown in FIG. 8, synchronization separation circuit 1 outputs to phase comparator 2 a signal which stays in low state (described "L") for a certain time period. When the signal a from synchronization separation circuit 1 is low, phase comparator 2 lowers its output voltage during a period while the other signal b is high ("H"). Contrary, when the other input signal b is low, phase comparator 2 raises its output voltage during the duration.

Signal C which was influenced in the level by signal a from synchronization separation circuit 1 and the other signal b proceeds via low-pass filter 3 and amplifier 4 to operate voltage control oscillator 5. The signal inputted to voltage control oscillator 5 turns out to be an output signal which oscillates at n-times the frequency. Frequency divider 6 divides the inputted signal into 1/n.

By connecting an AD converter (not shown) at the end stage of synchronization separation circuit 1 and inputting an analog signal to phase comparator 2, a phase synchronous control can be carried out by making used of a rectangular wave signal in place of analog signal. Patent Document 1 is an example of prior art technical documents related to the present invention.

However, if a digital signal is inputted to phase comparator 2 of a PLL circuit of conventional structure, period of signal input with one of the signals inputted to phase comparator 2 is shortened corresponding to an interval of sampling the digital signal. Consequently, the output of signal c which has undergone the level-shifting becomes smaller. This leads to instability of the fluctuation amount with the output frequency. This makes it difficult to adjust the phase accurately.

[Patent Document 1]
Japanese Patent Unexamined Publication No. S62-131630

SUMMARY OF THE INVENTION

The present invention aims to offer a PLL circuit which can adjust the phase accurately, and an angular velocity sensor which includes the PLL circuit.

A PLL circuit in the present invention includes an AD converter, a DA converter which an output from the AD converter is inputted, a filter circuit filtering an output signal from the DA converter, a voltage control oscillator outputting a signal of a different frequency in accordance with an output signal from the filter circuit and a frequency divider dividing a signal which the voltage control oscillator outputs. The AD converter operates by a timing signal outputted from the voltage control oscillator and the DA converter outputs an analog signal corresponding to a value which the AD converter outputs by the timing signal outputted from the frequency divider.

In the above-described setup, a value outputted from the AD converter by the timing signal outputted from the frequency divider corresponds to amount of phase displacement relative to the center value of sine wave which the frequency divider outputs. Therefore, it can adjust the phase accurately despite a time delay caused due to the digitization of signal.

An angular velocity sensor in the present invention comprises a sensor which includes an operation electrode, a sensing electrode and a monitor electrode; a drive circuit which includes an AD converter performing AD conversion to a signal outputted from the sensor, an AGC circuit setting an operation signal to a certain specific amplitude based on a signal outputted from the AD converter, and an operation circuit for applying a voltage to the operation electrode of sensor based on a signal outputted from the AGC circuit; a sensing circuit for converting a signal outputted from the sensing electrode of sensor into an angular velocity output signal; and a timing control circuit outputting a timing signal to the sensing circuit and the drive circuit. The timing control circuit is formed of a PLL circuit in accordance with the present invention.

BRIEF DESCRIPTION OF THE DRAWINGS

FIG. 7 is a circuit diagram of a conventional PLL circuit.

FIG. 8 is a timing chart used to describe the operating state of conventional PLL circuit.

REFERENCE MARKS IN THE DRAWINGS

21 AD Converter
22, 126 Phase Monitoring Part
23, 126b Phase Correcting Circuit
24 DA Converter
25, 127 Filter Circuit
26 Voltage Control Oscillator
27, 126a Frequency Divider
30 Sensor
32 Operation Electrode
33 Monitor Electrode
34, 35 Sensing Electrode
41 Drive Circuit
46, 111 Filter Circuit
47 AGC Circuit 23
61, 82 AD Converter
71 Timing Control Circuit
81 Sensing Circuit
43, 94 DA Conversion Part
121 PLL Circuit
129 Voltage Control Oscillator

DETAILED DESCRIPTION OF PREFERRED EMBODIMENTS (First Exemplary Embodiment)

Figure 1:
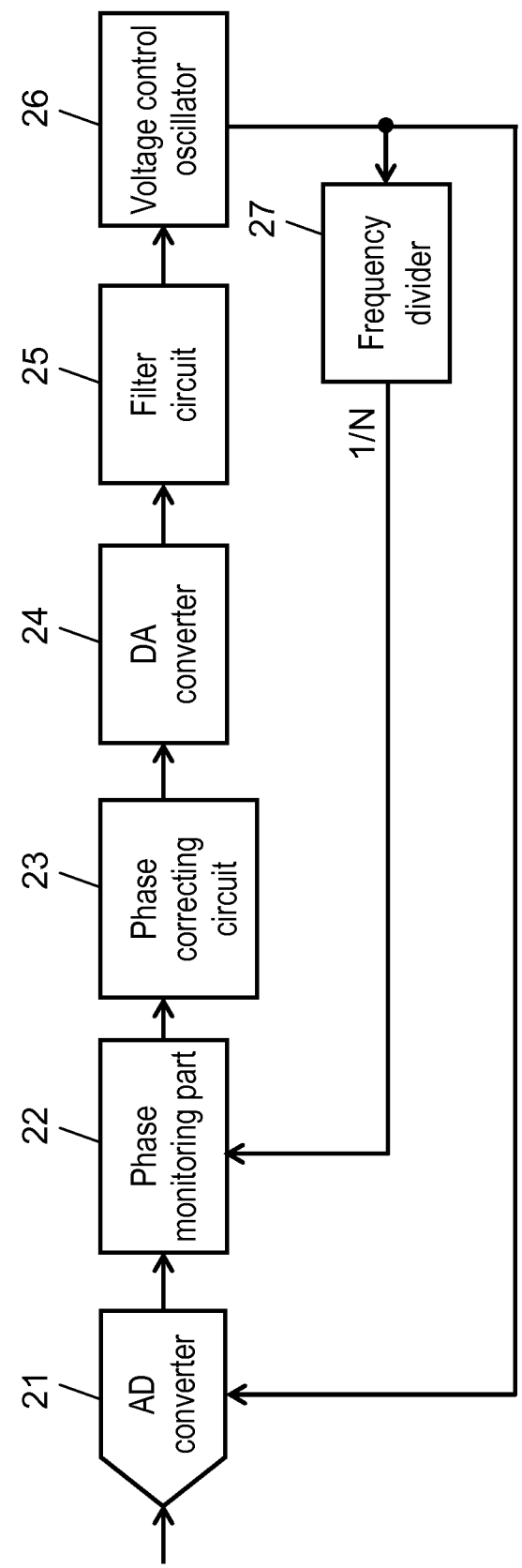
FIG. 1 shows the block diagram of a PLL circuit in accordance with a first exemplary embodiment of the present invention.

FIG. 1 shows a circuit diagram of PLL circuit in accordance with a first embodiment of the present invention. Reference is made to FIG. 1, AD converter 21 converts an analog signal inputted to the AD converter into a digital signal. Phase monitoring part 22 to which the digital signal outputted from AD converter 21 is inputted outputs a certain specific upper limit value, lower limit value or the value of an inputted signal as it is, depending on the value of the inputted signal and the timing when the signal was inputted. Phase correcting circuit 23 is inputted with the output signal from phase monitoring part 22. Phase correcting circuit 23 outputs a signal which being the inputted signal after it is corrected by a certain specific value. DA converter 24 is inputted with the signal outputted from phase correcting circuit 23. DA converter 24 outputs an analog signal corresponding to the inputted digital signal.

Filter circuit 25 consisting of loop filter is inputted with the analog signal outputted from DA converter 24. Filter circuit 25 outputs a signal after filtering the inputted signal with certain specific characteristics. Voltage control oscillator 26 is inputted with the signal outputted from filter circuit 25. Voltage control oscillator 26 outputs a first timing signal of a different frequency corresponding to a value of inputted analog signal. Frequency divider 27 is inputted with the signal outputted from voltage control oscillator 26. Frequency divider 27 outputs a second timing signal, which being the inputted signal after it is frequency-divided by a certain specific value (N).

As described in the above; in a PLL circuit in the first embodiment, AD converter 21 operates by the first timing signal outputted from voltage control oscillator 26, whereas phase monitoring part 22 operates by the second timing signal outputted from frequency divider 27.

Now, operation of the above-configured PLL circuit in the first embodiment is described with reference to FIG. 2 and FIG. 3.

Figure 2:
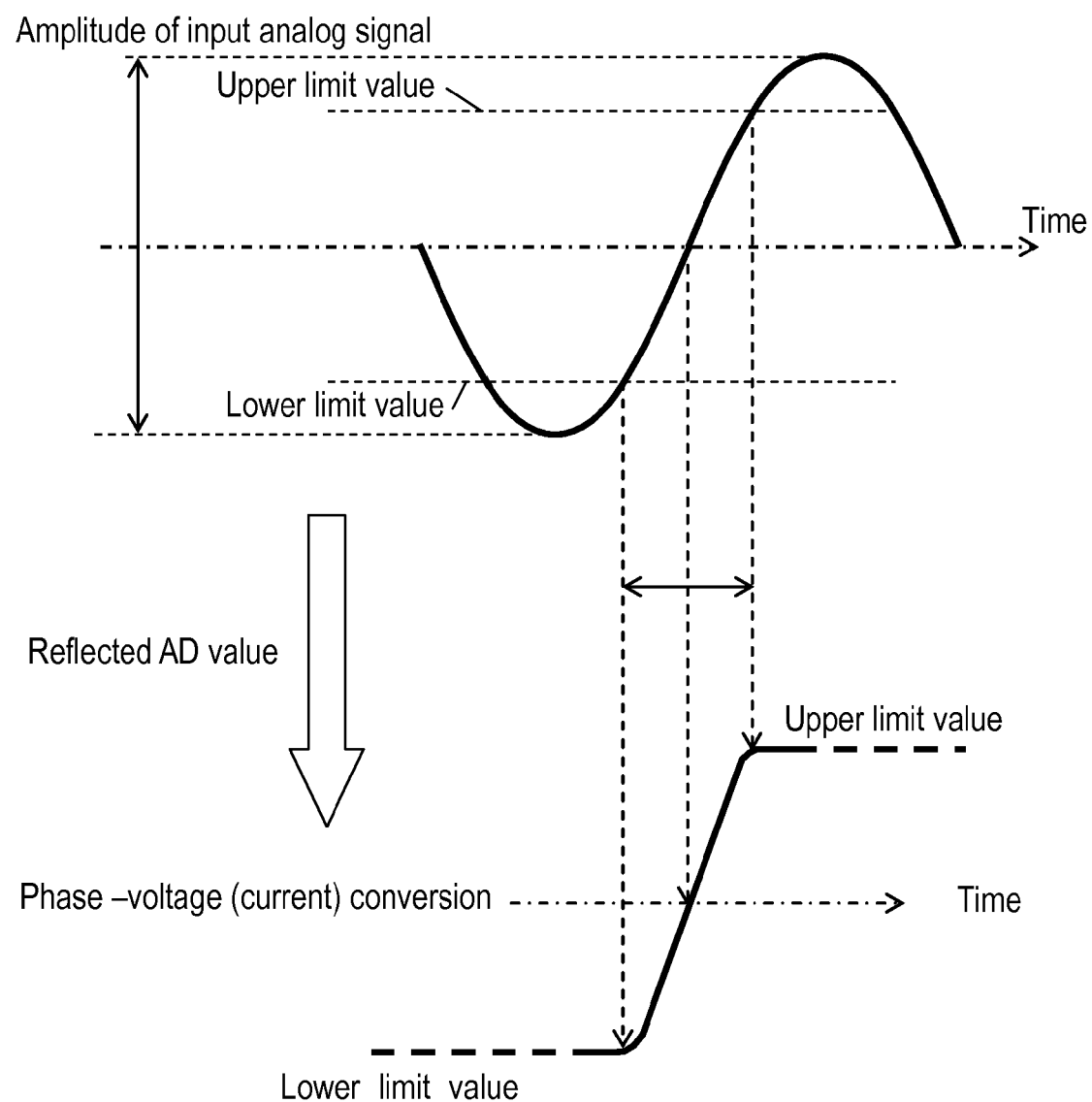
FIG. 2 is a chart used to describe operation of an AD converter in PLL circuit in accordance with the first embodiment of the present invention.

FIG. 2 is a chart used to describe operation of the AD converter in PLL circuit of the first embodiment of the present invention. Referring to FIG. 2, AD converter 21 is inputted with a sine wave analog signal. The signal is converted into a digital signal value corresponding to size of the analog signal which was sampled by the first timing signal outputted from voltage control oscillator 26. Phase monitoring part 22 is inputted with the digital signal value. The signal thus converted into digital signal is, for example, a positive/negative digital signal with the center value of inputted sine wave signal as "zero". Phase monitoring part 22 outputs a digital signal by the second timing signal outputted from frequency divider 27. The digital signal is inputted to phase correcting circuit 23, and corrected to a certain specific value. And then, the corrected digital signal is inputted to DA converter 24. DA converter 24 outputs an analog signal which was converted corresponding to the value of inputted digital signal. The analog signal is inputted to voltage control oscillator 26 via filter circuit 25 formed of loop filter. Voltage control oscillator 26 outputs a signal having a certain frequency that corresponds to the inputted analog signal. The signal thus outputted is the feedback as timing signal which is used for sampling the analog signal at AD converter 21.

The second timing signal is a synchronous signal generated as the result of frequency-dividing the first timing signal. An output value of digital signal from AD converter 21 sampled by the second timing signal corresponds to a value that represents quantity of phase displacement from the zero point, or the center value of sine wave signal of the second timing signal. The value remains to be identical with an output value from a phase comparator (not shown) of generally-used PLL circuit.

When a value of digital signal outputted from phase monitoring part 22 is negative, DA converter 24 outputs an analog signal which works to decrease the frequency outputted from voltage control oscillator 26. On the other hand, when a value of digital signal outputted from phase monitoring part 22 is positive, DA converter 24 outputs an analog signal which works to increase the frequency outputted from voltage control oscillator 26. Thus, the PLL circuit is loop-controlled so as analog signal outputted from DA converter 24 is held constant; in other words, a value of digital signal by the second sampling timing signal becomes "zero". Through the above-described control, a timing of sampling AD converter 21 is synchronized with that when an inputted analog signal marks the center value. Thus, the phase can be adjusted accurately.

Figure 3:
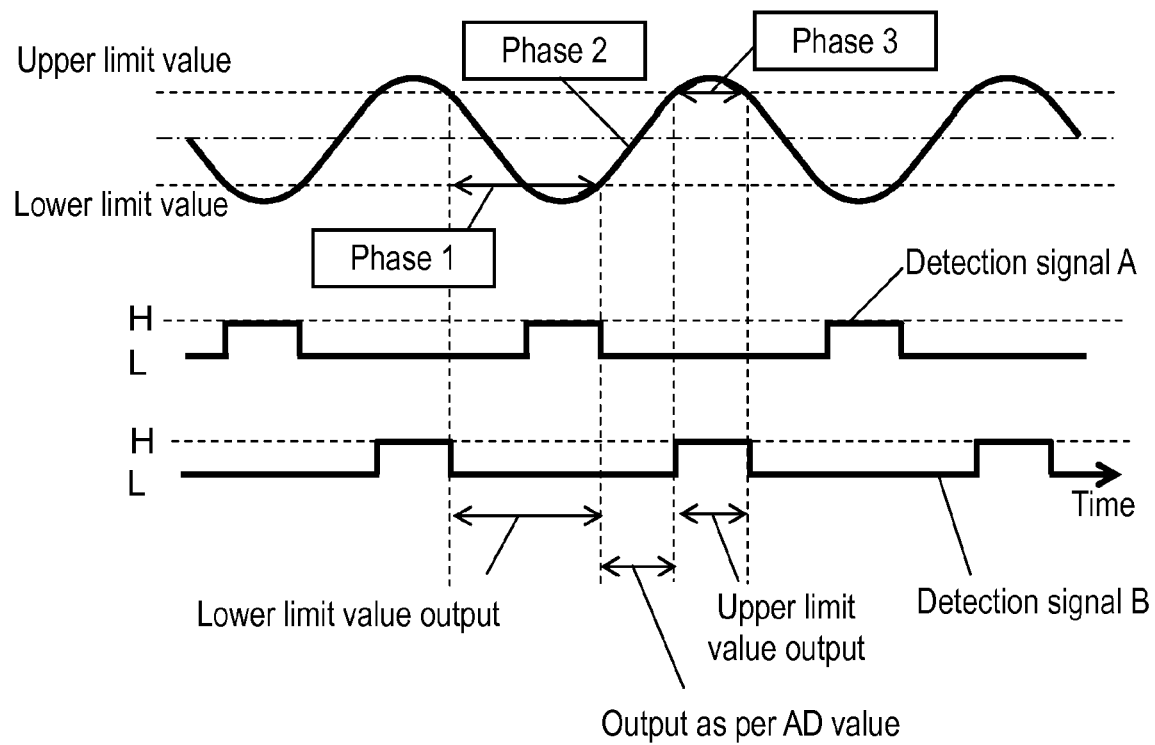
FIG. 3 is a chart used to describe operation of the phase monitoring part in a PLL circuit in accordance with the first embodiment.

FIG. 3 is a chart used to describe how a phase monitoring part of PLL circuit operates in the first embodiment. In FIG. 3, phase monitoring part 22 monitors if a value of digital signal inputted to phase monitoring part 22 goes beyond a certain specific upper limit value or lower limit value, or not. Value of digital signal outputted from phase monitoring part 22 is varied corresponding to timing when the second timing signal is inputted.

Describing practically; after the second timing signal is inputted, a certain time period after an inputted digital value became lower than a certain specific upper limit value, going further to be lower than a certain specific lower limit value, until it recovers the lower limit value is named Phase 1. From the end of Phase 1 until the inputted digital value exceeds the upper limit value is named Phase 2. Thenceforth, until it becomes to be lower than the upper limit value is named Phase 3. In Phase 1, when the second timing signal is inputted to phase monitoring part 22, it outputs the digital signal value of a certain specific lower limit. In Phase 2, when the second timing signal is inputted to phase monitoring part 22, it outputs the value of a digital signal inputted by the second timing signal. In Phase 3, when the second timing signal is inputted to phase monitoring part 22, it outputs a digital signal value of the certain specific upper limit.

Reference is made to FIG. 3; detection signal A in phase monitoring part 22 becomes H signal during a time period when it is below the lower limit value; the signal becomes L signal for the rest of the time period. Detection signal B in phase monitoring part 22 becomes H signal during the time period when it is above the upper limit value, whereas the signal becomes L signal during the rest of the period. Accordingly, by combining the states of detection signals A and B, the values of digital signal outputted from phase monitoring part 22 in Phase 1, Phase 2 and Phase 3 are determined.

DA converter 24 is inputted with a value of digital signal outputted from phase monitoring part 22. DA converter 24 outputs an analog signal corresponding to a value of inputted digital signal. The analog signal is inputted to filter circuit 25 formed of loop filter. In filter circuit 25, analog signal is filtered and then inputted to voltage control oscillator 26.

A frequency which is determined by a filtered analog signal corresponding to a value of the digital signal outputted from phase monitoring part 22 is outputted from voltage control oscillator 26. Since the phase judgment and setting of the upper limit and lower limit of output signal are made by phase monitoring part 22, voltage control oscillator 26 is inputted with an analog signal which is controlled within a certain range. Consequently, the frequency of analog signal outputted from voltage control oscillator 26 is limited. Therefore, a PLL circuit in accordance with the present invention can avoid over the entire working range such operation errors as locking at multiple frequencies, where locking tends to take place also at other frequencies besides the frequency which is an inputted analog signal frequency multiplied with a frequency-divided value (N) of frequency divider 27. Thus, the PLL circuit locks accurately at a certain specified frequency without fail.

At phase correcting circuit 23 to which a digital signal from phase monitoring part 22 is inputted, a locking phase can be fine-adjusted for a digital value's resolving capability by outputting the inputted digital signal after increasing/decreasing by a certain specific value. For example, if phase correcting circuit 23 outputs a digital signal after adding a positive value, voltage control oscillator 26 outputs a frequency which is increased for a portion corresponding to the added digital signal. As the result, it is locked at a point of advanced phase.

In a case where AD converter 21 outputs a digital signal with a delay of certain specific clock counts due to AD conversion, relevant operation, etc., it is locked at a phase dislocated corresponding to the delay. However, in a structure where phase monitoring part 22 outputs a digital signal value by a timing dislocated for clock counts corresponding to a delay from that by the second timing signal, it can be synchronized with the timing at which the center value of analog signal inputted by the second timing signal. In the above-described setup, it can be synchronized with the zero point, or the center value of analog signal, accurately.

(Second Exemplary Embodiment)

An angular velocity sensor using a PLL circuit in accordance with a second embodiment of the present invention is described referring to the drawings.

Figure 4:
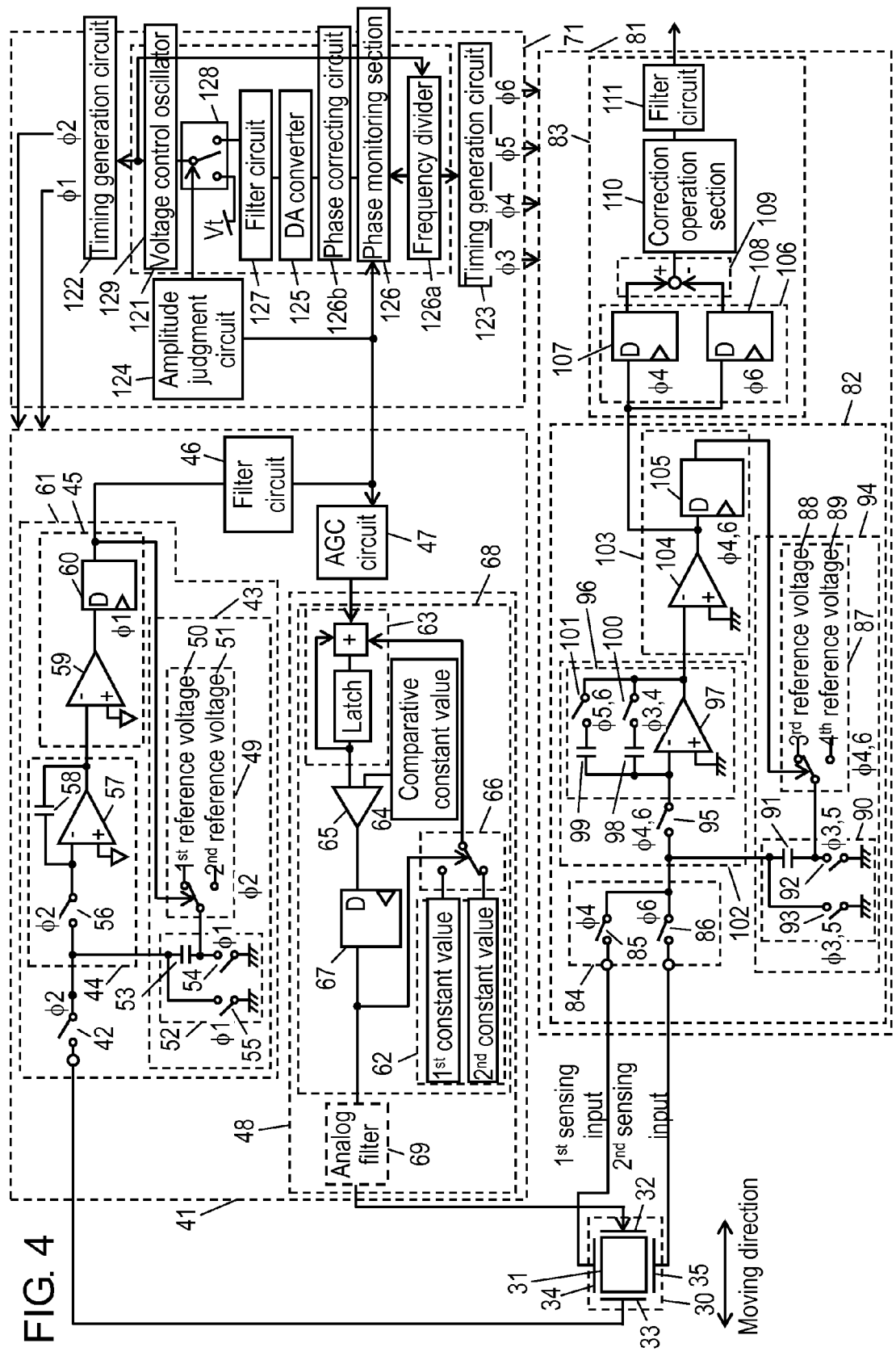
FIG. 4 is a circuit diagram showing an angular velocity sensor which includes a PLL circuit in accordance with a second exemplary embodiment of the present invention.

FIG. 4 shows a circuit of angular velocity sensor which includes PLL circuit in accordance with a second embodiment of the present invention. Reference is made to FIG. 4; sensor 30 includes vibration element 31, operation electrode 32 containing a piezoelectric element for vibrating vibration element 31, monitor electrode 33 containing a piezoelectric element which generates an electric charge corresponding to a state of vibration, and a couple of sensing electrodes containing a piezoelectric element which generates an electric charge when angular velocity is given to sensor 30. The couple of sensing electrodes of sensor 30 is formed of first sensing electrode 34 and second sensing electrode 35 which generates an electric charge having a polarity reverse to that of first sensing electrode 34.

Drive circuit 41 includes input switching device 42, DA conversion section 43, integration section 44, comparison section 45, filter circuit 46 formed of a digital filter, AGC circuit 47, and operation circuit 48. Input switching device 42 of drive circuit 41 is connected with monitor electrode 33 of vibration element 31, which device being formed with an analog switch operating by the second timing $\Phi 2$. DA switching section 49 of drive circuit 41 has a first reference voltage 50 and a second reference voltage 51. Switching between the first reference voltage 50 and the second reference voltage 51 is made by a certain specific signal at the second timing $\Phi 2$. Drive circuit 41 is provided with DA output section 52. DA output section 52 is formed of capacitor 53 to which an output signal from DA switching section 49 is inputted and analog switches 54, 55 connected with the both ends of capacitor 53, which switches operate by the first timing $\Phi 1$ for discharging the electric charge of the capacitor. DA switching section 49 and DA output section 52 constitute DA conversion section 43, which conversion section discharges electric charge of capacitor 53 by the first timing $\Phi 1$, charges by the second timing $\Phi 2$ an electric charge in accordance with a reference voltage which DA switching section 49 outputs. Analog switch 56 is inputted with an output from input switching device 42 and DA conversion section 43, and outputs by the second timing $\Phi 2$.

Integral section 44 is inputted with an output from analog switch 56, which integral section being formed of operation amplifier 57 and capacitor 58 which is connected with the feedback of operation amplifier 57. Integral section 44 operates by the second timing $\Phi 2$; an input signal to integral section 44 is integrated at capacitor 58. Comparing section 45 is inputted with an integral signal outputted from integral section 44. Comparing section 45 is formed of comparator 59 for comparing the integral signal with a certain specific value and a type D flip flop 60 to which a 1-bit digital signal outputted from comparator 59 is inputted. Type D flip flop 60 latches the 1-bit digital signal at the start of the first timing $\Phi 1$, and outputs a latch signal. The latch signal is inputted to DA switching section 49 of DA conversion section 43 for switching first reference voltage 50 and second reference voltage 51. Thus, input switching device 42, DA conversion section 43, integral section 44, and comparing section 45 constitute AD converter 61 consisting of $\Sigma\Delta$ modulator.

Pulse-number modulation signal outputted from AD converter 61 is inputted to filter circuit 46. There, a signal of resonance frequency of vibration element 31 is extracted, noise component is removed, and a multi-bit signal is outputted. The multi-bit signal is inputted to a half-wave rectifying filter circuit (not shown) provided in AGC circuit 47, and converted into an amplitude data signal. At AGC circuit 47, if the amplitude data signal is large-sized, the multi-bit signal inputted from filter circuit 46 is attenuated and then inputted to operation circuit 48. If the amplitude data signal is small-sized, the multi-bit signal inputted from filter circuit 46 is amplified and then inputted to operation circuit 48. Through these controls, the vibration of vibration element 31 is adjusted to exhibit constant amplitude.

Operation circuit 48 has digital $\Sigma\Delta$ modulator 68 and analog filter 69.

Digital ΣΔ modulator 68 includes digital value output section 62 keeping the binary value, summing integral operation section 63 for integrating a sum of an output signal from AGC circuit 47 and an output from digital value output section 62, value comparing section 65 comparing an output value from summing integral operation section 63 with comparative constant value 64, value switching section 66 switching digital values outputted from digital value output section 62 corresponding to a value outputted from value comparing section 65, and flip flop 67 latching an output from value comparing section 65 at a certain specific timing. The multi-bit signal outputted from AGC circuit 47 is modulated by ΣΔ modulator 68 into 1-bit pulse-number modulation signal, and then outputted. The pulse-number modulation signal is inputted to analog filter 69, and then outputted to sensor 30 after filtering a frequency component harmful for operating sensor 30.

Timing control circuit 71 is inputted with a multi-bit signal outputted from filter circuit 46 of drive circuit 41. Based on the multi-bit signal, a timing signal of the first timing $\Phi 1$ and a timing signal of the second timing $\Phi 2$ are generated, which are inputted to drive circuit 41. Also based on the multi-bit signal, a timing signal of the third timing $\Phi 3$, a timing signal of the fourth timing $\Phi 4$, a timing signal of the fifth timing $\Phi 5$, a timing signal of the sixth timing $\Phi 6$ are generated, which are inputted to sensing circuit 81. The internal structure of timing control circuit 71 will be detailed later.

Sensing circuit 81 is formed of AD converter 82 consisting of ΣΔ modulator and operation section 83. Input switching section 84 has analog switches 85 and 86. Analog switch 85 is connected with first sensing electrode 34 of sensor 30, and operates at the fourth timing $\Phi 4$. Analog switch 86 is connected with second sensing electrode 35 of sensor 30, and operates at the sixth timing $\Phi 6$.

In the above-described configuration, input switching section 84 outputs an output signal from first sensing electrode 34 or second sensing electrode 35 by switching the signals at the fourth timing $\Phi 4$ or the sixth timing $\Phi 6$.

DA switching section 87 has third reference voltage 88 and fourth reference voltage 89. Third reference voltage 88 and fourth reference voltage 89 are switched by a certain specific signal. DA outputting section 90 has capacitor 91 to which an output signal from DA switching section 87 is inputted, and analog switches 92 and 93. Analog switches 92, 93 are connected to the both ends of capacitor 91, respectively; they discharge electric charge of capacitor 91 operating in accordance with the third timing $\Phi 3$ and the fifth timing $\Phi 5$. DA switching section 87 and DA outputting section 90 constitute DA conversion section 94. DA conversion section 94 discharges electric charge of capacitor 91 in accordance with the third timing $\Phi 3$ and the fifth timing $\Phi 5$; furthermore, charges/discharges the electric charge corresponding to a reference voltage outputted from DA switching section 87 by the fourth timing $\Phi 4$ and the sixth timing $\Phi 6$.

Analog switch 95 is inputted with output from input switching section 84 and DA conversion section 94, and outputs at the fourth timing $\Phi 4$ and the sixth timing $\Phi 6$. Integral circuit 96 is inputted with an output from analog switch 95. Integral circuit 96 is formed of operation amplifier 97, a pair of capacitors 98 and 99 connected in parallel with the feedback of operation amplifier 97 and a pair of analog switches 100 and 101 connected with the capacitors 98 and 99. Analog switch 100 operates by the third timing $\Phi 3$ and the fourth timing $\Phi 4$, and input signal to integral circuit 96 is integrated in capacitor 98; an integral value is thus maintained. In the same manner, analog switch 101 operates by the fifth timing $\Phi 5$ and the sixth timing $\Phi 6$, and input signal to integral circuit 96 is integrated in capacitor 99; the integral value is thus maintained. Integral section 102 is formed of analog switch 95 and integral circuit 96.

Comparing section 103 is inputted with the integral signal outputted from integral section 102. Comparing section 103 is formed of comparator 104 for comparing the integral signal with a certain specific value and a type D flip flop 105 to which a 1-bit digital signal outputted from comparator 104 is inputted. Type D flip flop 105 latches a 1-bit digital signal at the start of the fourth timing $\Phi 4$ and the sixth timing $\Phi 6$, and outputs a latch signal. The latch signal is inputted to DA switching section 87 of DA conversion section 94, and switches the third and fourth reference voltages 88 and 89. Thus, AD converter 82 is formed of input switching section 84, DA conversion section 94, integral section 102 and comparing section 103.

In the above-described configuration, AD converter 82 ΣΔ modulates an electric charge outputted from sensor 30's first sensing electrode 34 and second sensing electrode 35, and outputs after converting into 1-bit digital signal.

Latch circuit 106 is inputted with a 1-bit digital signal outputted from comparator 104 of comparing section 104 in AD converter 82. Latch circuit 106 is formed of a pair of type D flip flops 107 and 108 latching a 1-bit digital signal. Type D flip flop 107 latches a 1-bit digital signal by the fourth timing $\Phi 4$. Type D flip flop 108 latches a 1-bit signal by the sixth timing $\Phi 6$. Difference operation section 109 is inputted with a pair of 1-bit digital signals which a pair of D type flip flops 107, 108 latched and outputted. A 1-bit differential operation for calculating a difference with the pair of 1-bit digital signal is realized by a displacement process. Describing practically, suppose a pair of 1-bit digital signals inputted to difference operation section 109 to be "00" "01" "10" "11", they are outputted after being replaced with "0" "−1" "1" "0", respectively.

Correcting operation part 110 is inputted with a 1-bit difference signal outputted from difference operation section 109. And then, the correcting operation with the 1-bit difference signal and a certain specific correction data is realized by a displacement process. Describing practically, suppose the 1-bit difference signal inputted to correcting operation part 110 are "0" "1" "−1", and correction data is, for example, "5", they are replaced with "0" "5" "−5", respectively, and then outputted.

Filter circuit 111 consisting of digital filter is inputted with a digital difference signal outputted from correcting operation part 110. Filter circuit 111 filters noise component. Operation section 83 is formed of latch circuit 106, difference operation section 109, correcting operation part 110 and filter circuit 111. Operation section 83 latches a pair of 1-bit digital signals by the fourth timing $\Phi 4$ and the sixth timing $\Phi 6$, performs differential operation, correcting operation and filtering, and then outputs a multi-bit signal.

Timing control circuit 71 is formed of PLL circuit 121, timing generating circuits 122 and 123, and amplitude judgment circuit 124.

PLL circuit 121 gradually multiplies the frequency of multi-bit signal outputted from filter circuit 46 of drive circuit 41, integrates time-wise the phase noise and decreases it, and then outputs a certain required signal to timing generating circuits 122 and 123. Phase monitoring part 126 is inputted with a rectangular-wave signal which being a multi-bit signal outputted from filter circuit 46 and reshaped in the wave form, and an output signal from frequency divider 126a. The second timing signal of frequency divider 126a is a synchronous signal generated as the result of frequency-dividing a first timing signal from voltage control oscillator 129, which will be described later. The output value of a digital signal outputted from drive circuit 41 by the second timing signal represents itself a value which corresponds to an amount of phase shift from the zero point, or the center value of sine wave signal by the second timing signal. Signal outputted from phase monitoring part 126 is inputted via phase correcting circuit 126b and DA converter 125, to filter circuit 127 which constitutes a loop filter. Filter circuit 127 converts it into a direct current signal which contains less alternating current component. The output signal of filter circuit 127 and the constant voltage value are inputted to timing switching section 128. One terminal of timing switching section 128 is connected with filter circuit 127, while the other terminal is electrically coupled with a constant voltage output device.

Amplitude judgment circuit 124 is inputted with a multi-bit signal outputted from filter circuit 46. Amplitude judgment circuit 124 monitors the amplitude data of a multi-bit signal outputted from filter circuit 46. Based on control signal from amplitude judgment circuit 124, a signal of timing switching section 128 is selected. Describing practically, if the amplitude data indicates that it exceeds target amplitude, timing switching section 128 selects the output signal of filter circuit 127. On the other hand, if amplitude data of multi-bit signal outputted from filter circuit 46 indicates that it is less than target amplitude, timing switching section 128 selects the constant voltage value.

Output voltage from timing switching section 128 is inputted to voltage control oscillator 129. Voltage control oscillator 129 is a variable frequency oscillator which oscillates a frequency signal corresponding to input voltage. Oscillation signal outputted from voltage control oscillator 129 is inputted to frequency divider 126a and timing generating circuits 122 and 123.

Based on a signal outputted from PLL circuit 121, timing generating circuit 122 generates a timing signal of the first timing Φ1 and a timing signal of the second timing Φ2, and outputs these to drive circuit 41. Timing generating circuit 123 divides monitor signal of 2 cycle-periods into the third timing Φ3, the fourth timing Φ4, the fifth timing Φ5 and the sixth timing Φ6, for generating respective timing signals, and outputs these to sensing circuit 81.

Operation of the above-configured angular velocity sensor using PLL circuit in the second embodiment is described in the below.

As soon as an operation signal is applied on operation electrode 32 of sensor 30, vibration element 31 resonates, and a certain electric charge is generated on monitor electrode 33. The electric charge is inputted to AD converter 61 of drive circuit 41, and converted into a pulse-number modulation signal. The modulation signal is inputted to filter circuit 46. Resonance frequency of vibration element 31 is extracted from filter circuit 46, and a multi-bit signal without noise component is thus generated.

Operation of AD converter 61 at this state is described below. AD converter 61 operates by repeating the first timing Φ1 and the second timing Φ2, which being the timing synchronized with monitor signal outputted form timing control circuit 71. At the first timing Φ1, a signal outputted from monitor electrode 33 of sensor 30 is ΣΔ modulated, and converted into 1-bit digital signal.

The operation at the two timings is outlined one by one. At the first timing Φ1, an integrated value kept in capacitor 58 of integral section 44 is inputted to comparator 59 of comparing section 45 for comparison. A 1-bit digital signal outputted from comparator 59 is latched at the start of first timing Φ1 by type D flip flop 60. And then, the latch signal is inputted to DA switching section 49 of DA conversion section 43. Analog switch 54 and analog switch 55 in DA output section 52 are turned ON, and the electric charge kept in capacitor 53 is discharged.

Next, at the second timing Φ2, the first reference voltage 50 and the second reference voltage 51 are switched corresponding to a latch signal inputted to DA switching section 49, and inputted to capacitor 53. Electric charge is outputted in accordance with a reference voltage that was switched by DA conversion section 43. Also, input switching device 42 is turned ON, and an electric charge generated from monitor electrode 33 of sensor 30 is inputted. Further, analog switch 56 in integral section 44 is turned ON, and an electric charge outputted from input switching device 42 and DA conversion section 43 is inputted to integral section 44.

Figure 5:
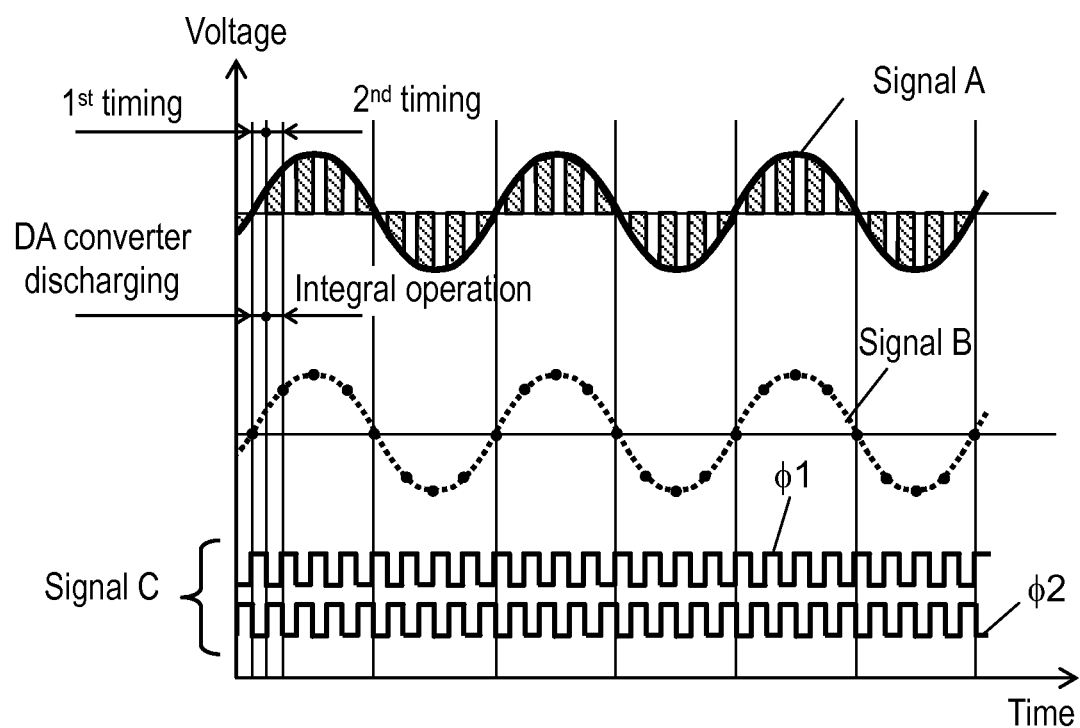
FIG. 5 is a chart which shows operation of an angular velocity sensor which includes a PLL circuit in accordance with the second embodiment of the present invention.

FIG. 5 is a chart used to describe how an angular velocity sensor using PLL circuit in the second embodiment of the present invention operates. Referring to FIG. 5, at the second timing Φ2, total sum of an amount of electric charge represented by the shadowed portion of signal A and an amount of electric charge outputted from DA conversion section 43 are integrated and kept in capacitor 58 in integral section 44. As the result of operation by the first timing Φ1 and the second timing Φ2 described in the above, an amount of electric charge corresponding to amplitude value outputted from monitor electrode 33 of sensor 30 is ΣΔ modulated, and a 1-bit digital signal is outputted at the starting of first timing Φ1 signal.

As the result of the above-described processing, an amount of electric charge outputted from monitor electrode 33 of sensor 30 is ΣΔ modulated by AD converter 61, and outputted as 1-bit digital signal at the timing described in the above.

In FIG. 5, signal B shows ΣΔ modulated multi-bit signal of angular velocity sensor which includes a PLL circuit in the second embodiment of the present invention. Signal C shows the first timing Φ1 and the second timing Φ2 generated from PLL circuit in the second embodiment. Multi-bit signal outputted from filter circuit 46 of drive circuit 41 is inputted to a half-wave rectifying filter circuit (not shown) in AGC circuit 47 is converted into an amplitude data signal. In AGC circuit 47, if the amplitude data signal is large-sized, the multi-bit signal of filter circuit 46 is attenuated and then inputted to operation circuit 48. On the other hand, if the amplitude data signal is small-sized, the multi-bit signal outputted from filter circuit 46 is amplified and then inputted to operation circuit 48. Through these controls, the vibration of vibration element 31 is adjusted to exhibit certain constant amplitude.

Summing integral operation section 63 of digital ΣΔ modulator 68 is inputted with a multi-bit signal outputted from AGC circuit 47 and a constant value outputted from value switching section 66, which switching section outputs either one of the two values outputted from digital value output section 62 keeping a certain binary value. These signals are summed and then integrated. Integrated value outputted from summing integral operation section 63 is compared to comparative constant value 64 by value comparing section 65; result of the comparison is outputted from value comparing section 65. Flip flop 67 latches the result of comparison at a certain specific timing. A constant value which is outputted from value switching section 66 is switched by the output from flip flop 67. When, if the output value from summing integral operation section 63 is smaller than comparative constant value 64, the greater value of binary values of digital value output section 62 is chosen. On the other hand, if it is greater than comparative constant value 64, the smaller value of binary values of digital value output section 62 is chosen. By repeating the above procedure, the multi-bit signal outputted from AGC circuit 47 is modulated into a 1-bit pulse-number modulation signal, and outputted from flip flop 67. If the signal inputted to digital ΣΔ modulator 68 is, for example, 10 bit (=±9 bit), it is preferred to designate comparative constant value 64 at "0", and the binary values of digital value output section 62 at not less than "511" "−511".

Since the ΣΔ modulation is accompanied by an over-sampling and the quantization noise is noise-shaped to the higher range, it contains noise component of high frequency component. Sensor 30, however, is unable to respond to such high frequency. Consequently, vibration is caused at a certain specific frequency component of the over-sampling, not at the sampling frequency of the pulse-number modulation signal. Further, in a case where sensor 30 has a high gain in responding to high frequency and such a noise of high frequency component causes any difficulty, analog filter 69 designed for decreasing such a frequency component of the output signal from digital ΣΔ modulator 68 may be added. By so doing, a drive circuit 41 of a lower-noise and higher-precision can be realized.

In a state where sensor 30 is making a bending vibration and moving at velocity V along the direction illustrated in FIG. 4, if sensor 30 revolves around the center axis in the length direction of vibration element 31 at angular velocity ω, Coriolis force F=2 mV×ω is caused with sensor 30.

Figure 6:
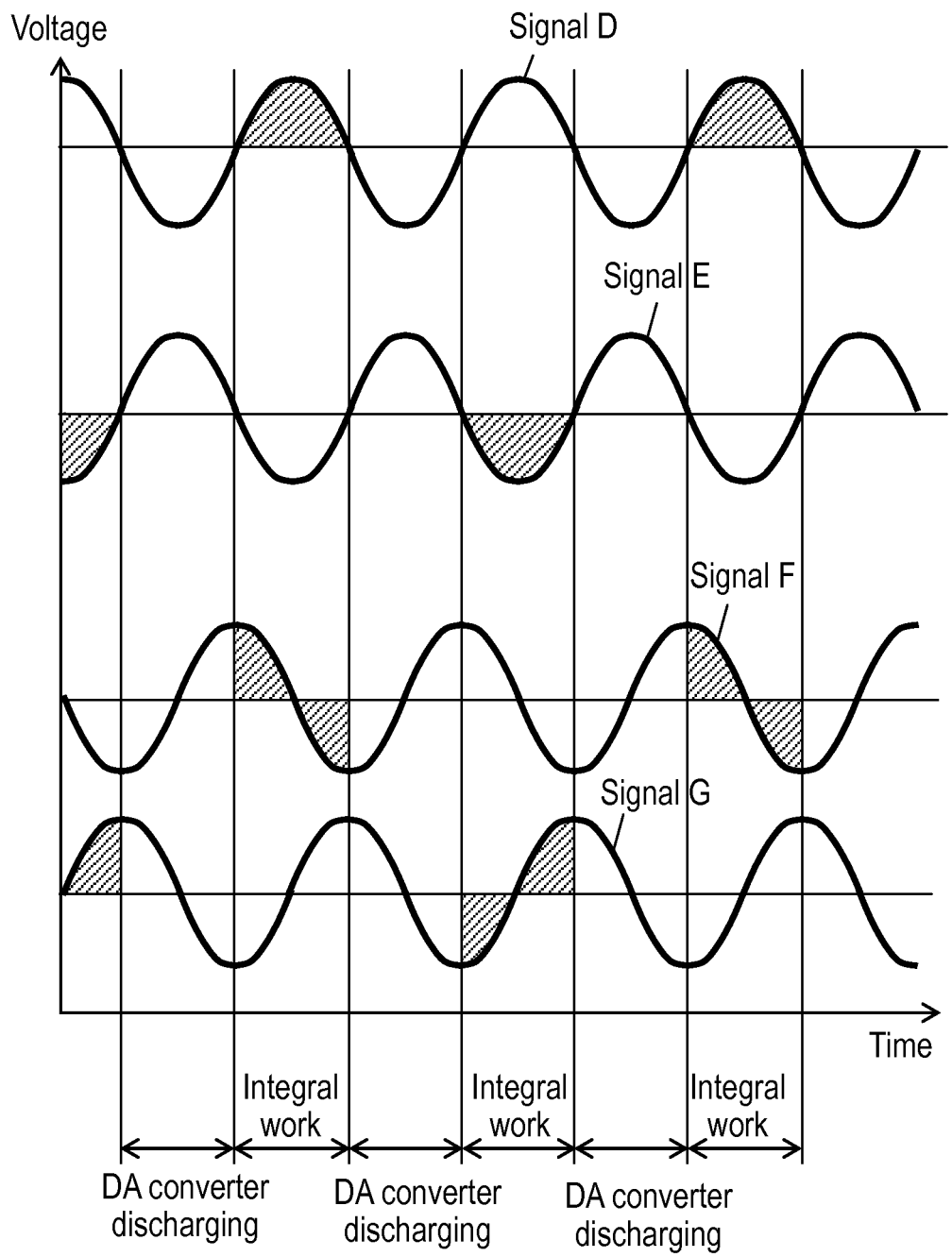
FIG. 6 is a chart used to show electric charges generated in a sensor of angular velocity sensor in accordance with the second embodiment.

FIG. 6 shows output signals generated in a sensor of angular velocity sensor in the second embodiment. As signal D and signal E in FIG. 6 show, an electric charge is generated with a couple of sensing electrodes 34 and 35 of sensor 30 by the Coriolis force. Since the electric charge of the sensing electrodes is caused by the Coriolis force, it has a phase that is advanced by 90 degrees as compared with that of monitor electrode 33. Output signals generated in the couple of sensing electrodes 34 and 35 have a relation, positive polarity signal and negative polarity signal.

Operation of AD converter 82 in this stage is described. AD converter 82 operates by repeating the third timing Φ3, the fourth timing Φ4, the fifth timing Φ5 and the sixth timing Φ6. At the third timing Φ3 and the fourth timing Φ4, positive polarity signal outputted from sensing electrode 34 of sensor 30 is ΣΔ modulated into a 1-bit digital signal. At the fifth timing Φ5 and the sixth timing Φ6, negative polarity signal is ΣΔ modulated into a 1-bit digital signal.

Operations at the above four timings are described one by one. First, at the third timing Φ3, analog switch 100 connected with capacitor 98 in integral section 102 turns ON. Integrated value kept in capacitor 98 is inputted to comparator 104 in comparing section 103. Comparator 104 outputs the result of comparison as a 1-bit digital signal. Analog switches 92 and 93 of DA conversion section 94 become ON, and an electric charge kept in capacitor 91 is discharged.

Next, at the fourth timing Φ4, a 1-bit digital signal is latched by type D flip flop 105 at the starting of the fourth timing Φ4. The latch signal is inputted to DA switching section 87 in DA conversion section 94. Corresponding to the inputted latch signal, the third and the fourth reference voltages 88, 89 are switched and inputted to capacitor 91. Electric charge corresponding to the switched reference voltage is outputted from DA conversion section 94. When, analog switch 85 in input switching section 84 turns ON, and an electric charge generated from first sensing electrode 34 of sensor 30 is outputted. Furthermore, analog switch 95 of integral section 102 turns ON, and an electric charge outputted from input switching section 84 and DA conversion section 94 is inputted to integral circuit 96. As the result of these operations, at the fourth timing Φ4, total sum of electric charge amounts shown shaded in FIG. 6 and an amount of electric charge outputted from DA conversion section 94 are integrated and kept in capacitor 98 of integral circuit 96.

By the above-described operations at the third timing Φ3 and the fourth timing Φ4, an amount of electric charge equivalent to one half of the amplitude value outputted from first sensing electrode 34 of sensor 30 is ΣΔ modulated. In the same manner as at the third timing Φ3 and the fourth timing Φ4, an amount of electric charge equivalent to one half of the amplitude value outputted from second sensing electrode 35 of sensor 30 is ΣΔ modulated at the fifth timing Φ5 and the sixth timing Φ6.

As the result of above operations, an amount of electric charge equivalent to one half of the amplitude of electric charge outputted from a couple of sensing electrodes 34 and 35 of sensor 30 is ΣΔ modulated by the one AD converter 82 and outputted a pair of 1-bit digital signal at the above-described timing.

The electric charge outputted from a couple of sensing electrodes 34 and 35 includes not only a sensing signal the phase of which is advanced by 90 degrees from that of signal generated in monitor electrode 33 but it also includes an unnecessary signal of the same phase as monitor signal. Now, description is made on a case where a composite signal of sensing signal and unnecessary signal is outputted from a couple of sensing electrodes 34 and 35 of sensor 30.

A sensing signal generated by Coriolis force due to angular velocity is shown with signal D and signal E in FIG. 6. Based on the fourth timing Φ4 and the sixth timing Φ6, an amount of electric charge represented by shaded areas of signal D and signal E in FIG. 6, or an amount equivalent to one half the amplitude value, are integrated by integral circuit 96.

Signal F and signal G in FIG. 6 show an unnecessary signal generated in a sensor of angular velocity sensor in the second embodiment of the present invention. Reference is made to signal F and signal G; in the same manner as the sensing signal, an amount of electric charge represented by shaded areas, namely, an amount of electric charge represented by a section from the greatest value to the smallest value of amplitude of unnecessary signal is integrated based on the fourth timing Φ4 and the sixth timing Φ6. When integrated using the center value of amplitude as the reference, the positive and negative electric charges cancel to each other producing "zero" electric charge. In other words, the unnecessary signal is cancelled by the operation of integral section 102 by the fourth timing Φ4 and the sixth timing Φ6. Through these operations, a so-called synchronized detection processing is enforced on each of a pair of input signals, where electric charge amount is integrated corresponding to amplitude of sensing signal. As the result, a signal after the synchronized detection processing is ΣΔ modulated, and a necessary signal component is converted into a 1-bit digital signal and outputted from AD converter 82; in the same way as the case without unnecessary signal.

Thus, a pair of output signals of sensor 30 can be ΣΔ modulated while undergoing the synchronized detection process. So, a digital signal after the synchronized detection can be taken out without requiring such analog circuits as generally-used IV converter circuit, phase device, synchronized detection circuit, etc. Therefore, a required digital signal can be made available through a circuit of very small scale, and at low cost.

Next, operation of operation section 83 is described. First, based on the fourth timing Φ4, a 1-bit digital signal outputted from comparator 104 of comparing section 103 in AD converter 82 is latched by type D flip flop 107 of latch circuit 106. Also, based on the sixth timing Φ6, a 1-bit digital signal outputted from comparator 104 of comparing section 103 in AD converter 82 is latched by type D flip flop 108 of latch circuit 106.

The pair of 1-bit digital signals latched by the pair of type D flip flops 107, 108 represents those amount of electric charges identical to half the amplitude amount of those signals outputted from a pair of sensing electrodes 34, 35 of sensor 30 minus unnecessary signal converted respectively into digital value through ΣΔ modulation. Next, a pair of 1-bit digital signals outputted from latch circuit 106 is inputted to 1-bit difference operation section 109. The 1-bit difference operation section 109 calculates a difference in the pair of 1-bit digital signals, and outputs a 1-bit differential signal.

The 1-bit differential signal at the third timing Φ4 represents a difference in 1-bit digital signals latched by the fourth timing Φ4, the sixth timing Φ6 of the synchronization one cycle earlier. The 1-bit differential signal represents an amplitude value of signal outputted from a pair of sensing electrodes 34, 35 of sensor 30 minus unnecessary signal.

In the above-described operations, a pair of signals, having the positive polarity and the negative polarity to each other, outputted from a pair of sensing electrodes 34, 35 of sensor 30 are integrated by the one integral section 102. Therefore, as compared with a case where the integral operation is carried out separately using two different integral circuits, an influence on relative error with integral results of a pair of input signals caused due to a difference in the characteristics between the integral circuits used is significantly reduced. Likewise, signal processing of a pair of input signals is conducted by the one DA conversion section 94. Also, a pair of integral results is compared by comparing section 103 using the same reference voltage and comparator. As the result, an influence to the relative errors with the result of comparison caused due to difference in the characteristics between the comparators and the variation in reference voltage is significantly reduced. Since a pair of input signals is processed using the same one integral circuit 96, DA conversion section 94, comparing section 103, as described in the above, an influence on the results caused due to the relative errors among the components employed is remarkably lowered as compared with a case where the signals are processed through a plurality of components.

Furthermore, a fluctuation in the reference voltage at each block caused by fluctuation of supply voltage, ambient temperature, and the like influence factors effect equally on a pair of input signals. A difference in the result of processing a pair of input signals is handled by using 1-bit difference operation section 109 in operation section 83; so, influential elements such as fluctuation of voltage fluctuation, etc. in respective parts can be cancelled. Therefore, a difference in a pair of input signals can be AD-converted precisely.

Furthermore, the influence of noise component having the same phase containing a pair of input signals which is outputted from a pair of sensing electrodes 34, 35 of sensor 30 and inputted to AD converter 82, and the offset component can be cancelled. Thus, a difference signal of a pair of input signals can be formed accurately.

Still further, in the 1-bit difference calculation for taking a difference with a pair of input signals, a pair of comparative signals inputted to difference operation section 109 is limited to four kinds, "00" "01" "10" "11", if the output signal of comparing section 103 is 1-bit signal consisting of "1" "0". Result of the difference is also determined in advance as "0" "−1" "1" "0". By taking advantage of these 1-bit digital operations, result of subtraction processing corresponding to an input signal can be obtained using a very simple circuit structure. In this way, a pair of input signals after subtraction processing is made into a difference signal, and then such signal processing as the low-pass, decimation, etc. is conducted by filter circuit 111 consisting of digital filter. Thus, such operation circuits as difference operation section 109, filter circuit 111 consisting of digital filter can be implemented as the circuit of very small scale, and at low cost. However, it realizes a high accuracy signal processing.

The 1-bit difference signal outputted from 1-bit difference operation section 109 is inputted to corrective operation section 110. Corrective operation with the 1-bit difference signal and a certain corrective information is conducted through a displacement process. The corrective operation is carried out by taking advantage of that the 1-bit difference signal is limited to 3 values, "0" "1" "−1"; in a case where a certain corrective information is, for example, "5", it is carried out by substituting the 1-bit difference signal "0" "1" "−1" inputted to corrective operation section are substituted with "0" "5" "−5", respectively.

Multi-bit signal outputted from filter circuit 46 is inputted to amplitude judgment circuit 124 in timing control circuit 71, also to phase monitoring section 126 as a wave form-shaped rectangular wave signal. Amplitude judgment circuit 124 monitors the amplitude data of multi-bit signal outputted from filter circuit 46.

If the amplitude data indicates that it is more than 50% of a target amplitude, timing switching section 128 is switched to choose an output signal of filter circuit 127 consisting of loop filter. When, PLL circuit 121 becomes close-looped, and gradually multiplies a monitor signal of tuning fork driving frequency which is used as the input signal, and outputs a signal which is the phase noise integrated time-wise and reduced. Thus, a signal synchronized with the intrinsic operation frequency of sensor 30 is inputted to timing generation circuits 122 and 123.

On the other hand, if amplitude data of the multi-bit signal outputted from filter circuit 46 indicates that it is less than 50% of a target amplitude, timing switching section 128 is switched to choose a constant voltage value. When, voltage control oscillator 129 outputs a fixed frequency signal in accordance with a constant voltage value, and the signal is inputted to timing generation circuits 122 and 123.

Based on a signal outputted from PLL circuit 121 under the above-described conditions, timing generation circuit 122 generates and outputs timing signal of the first timing Φ1, the second timing Φ2 as shown in FIG. 5C, which signals being used as the switching timing for input switching device 42, DA switching section 49, analog switches 54, 55, 56, and type D flip flop 60 in drive circuit 41. Timing generation circuit 123 generates and outputs timing signals of the third timing Φ3, the fourth timing Φ4, the fifth timing Φ5, the sixth timing Φ6, which signals being used as the switching timing for input switching device 84, DA switching section 87, analog switches 92, 93, 95, 100, 101 and type D flip flop 105 in sensing circuit 81.

Industrial Applicability

A PLL circuit in accordance with the present invention is capable of adjusting the phase accurately despite a possible time delay caused due to digitization of a signal. The advantage provided by the PLL circuit seems to be valued especially in the fields of posture control with aeronautic facilities, automobiles and the like mobile equipment, as well as in the navigation systems.

The invention claimed is:
1. A PLL circuit comprising:
an AD converter configured to output a digital signal;

a phase monitoring part circuit configured to monitor a phase displacement of the digital signal outputted from the AD converter;

a DA converter configured to output an output signal;

a voltage control oscillator configured to output a first timing signal in accordance with the output signal outputted from the DA converter; and a frequency divider configured to divide the first timing signal to a second timing signal, wherein the AD converter operates by the first timing signal outputted from the voltage control oscillator, wherein the phase monitoring part outputs, based on the second timing signal, a signal corresponding to the phase displacement, wherein the value of the signal outputted from the phase monitoring part limits to an upper limit value, and wherein the upper limit value is a value less than a maximum possible value of the value of the digital signal outputted from the AD converter.

2. The PLL circuit of claim 1, further comprising a phase correcting circuit disposed between the phase monitoring part and the DA converter, wherein the phase correcting circuit corrects value of the signal outputted from the phase monitoring part.

3. The PLL circuit of claim 1, wherein the DA converter outputs an analog signal corresponding to a value which the AD converter outputs at a timing displaced relative to the second timing signal outputted from the frequency divider by a number of clock counts required by the AD converter for performing AD conversion.

4. An angular velocity sensor comprising:

a sensor which includes an operation electrode, a sensing electrode and a monitor electrode;

a drive circuit which includes the AD converter of the PLL circuit of claim 1;

a sensing circuit for converting a signal outputted from the sensing electrode of the sensor into an angular velocity output signal; and a timing control circuit for outputting a timing signal based on the first timing signal to the sensing circuit and the drive circuit, the timing control circuit including the phrase monitoring part, the DA converter, the voltage oscillator, and the frequency divider of the PLL circuit of claim 1.

5. The PLL circuit of claim 1, wherein the value of the signal outputted from the phase monitoring part is one of (i) the upper limit value, (ii) a lower limit value, and (iii) the value of the digital signal outputted from the AD converter, and wherein the lower limit value is a value that is greater than a minimum possible value of the value of the digital signal outputted from the AD converter.

6. The PLL circuit of claim 1, further comprising a filter circuit configured to filter the output signal output from the DA converter and to input a signal to the voltage control oscillator.

7. The angular velocity sensor of claim 4, wherein the driver circuit includes:

the AD converter performing AD conversion to the digital signal from an analog signal outputted by the sensor;

an AGC circuit configured to set an operation signal to a specific amplitude based on the digital signal outputted from the AD converter; and an operation circuit configured to apply a voltage to the operation electrode of the sensor based on the operation signal outputted from the AGC circuit.

8. A PLL circuit comprising:

an AD converter configured to output a digital signal;

a phase monitoring part circuit configured to monitor a phase displacement of the digital signal outputted from the AD converter;

a DA converter configured to output an output signal;

a voltage control oscillator configured to output a first timing signal in accordance with the output signal outputted from the DA converter; and a frequency divider configured to divide the first timing signal to a second timing signal, wherein the AD converter operates by the first timing signal outputted from the voltage control oscillator, wherein the phase monitoring part outputs, based on the second timing signal, a signal corresponding to the phase displacement, wherein the value of the signal outputted from the phase monitoring part limits to a lower limit value, and wherein the lower limit value is a value that is greater than a minimum possible value of the value of the digital signal outputted from the AD converter.

9. The PLL circuit of claim 8, wherein the value of the signal outputted from the phase monitoring part is one of (i) an upper limit value, (ii) the lower limit value, and (iii) the value of the digital signal outputted from the AD converter, and wherein the upper limit value is a value less than a maximum possible value of the value of the digital signal outputted from the AD converter.

10. A PLL circuit comprising:

an AD converter configured to output a digital signal;

a phase monitoring part circuit configured to monitor a phase displacement of the digital signal outputted from the AD converter;

a DA converter configured to output an output signal;

a voltage control oscillator configured to output a first timing signal in accordance with the output signal outputted from the DA converter; and a frequency divider configured to divide the first timing signal to a second timing signal, wherein the AD converter operates by the first timing signal outputted from the voltage control oscillator, wherein the phase monitoring part outputs, based on the second timing signal, a signal corresponding to the phase displacement, wherein the value of the signal outputted from the phase monitoring part is based on (i) a first detection signal and (ii) a second detection signal, wherein the first detection signal indicates a time period when the value of the digital signal outputted from the AD converter is lower than a lower limit value, the lower limit value being a value that is greater than a minimum possible value of the value of the digital signal outputted from the AD converter, and wherein the second detection signal indicates a time period when the value of the digital signal outputted from the AD converter is greater than an upper limit value, the upper limit value being a value less than a maximum possible value of the value of the digital signal outputted from the AD converter.

11. The PLL circuit of claim 10, wherein the value of the signal outputted from the phase monitoring part is one of (i) the upper limit value, (ii) the lower limit value, and (iii) the value of the digital signal outputted from the AD converter.

* * * * *